United States Patent
Jameson et al.

(10) Patent No.: US 8,624,219 B1
(45) Date of Patent: Jan. 7, 2014

(54) VARIABLE IMPEDANCE MEMORY ELEMENT STRUCTURES, METHODS OF MANUFACTURE, AND MEMORY DEVICES CONTAINING THE SAME

(75) Inventors: John Ross Jameson, Burlingame, CA (US); Antonio R. Gallo, San Mateo, CA (US); Foroozan Sarah Koushan, San Jose, CA (US); Michael A. Van Buskirk, Saratoga, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 0 days.

(21) Appl. No.: 13/445,389

(22) Filed: Apr. 12, 2012

(51) Int. Cl.
*H01L 47/00* (2006.01)
(52) U.S. Cl.
USPC . 257/4; 257/3; 257/42; 257/43; 257/E45.002; 257/E45.003; 438/85; 438/104
(58) Field of Classification Search
USPC .............. 257/4, 3, 42, 43, E45.002, E45.003; 438/85, 104
See application file for complete search history.

(56) References Cited

U.S. PATENT DOCUMENTS

| | | | |
|---|---|---|---|
| 6,635,914 B2 | 10/2003 | Kozicki et al. | |
| 6,825,489 B2 | 11/2004 | Kozicki | |
| 6,985,378 B2 | 1/2006 | Kozicki | |
| 7,215,568 B2 | 5/2007 | Liaw et al. | |
| 7,372,065 B2 | 5/2008 | Kozicki et al. | |
| 7,385,219 B2 | 6/2008 | Kozicki et al. | |
| 7,397,688 B2 | 7/2008 | Tajiri | |
| 7,405,967 B2 | 7/2008 | Kozicki et al. | |
| 7,423,281 B2 | 9/2008 | Rohr | |
| 7,728,322 B2 | 6/2010 | Kozicki | |
| 2012/0097913 A1* | 4/2012 | Liu et al. | 257/3 |
| 2012/0097916 A1* | 4/2012 | Tada et al. | 257/4 |

* cited by examiner

*Primary Examiner* — Tu-Tu Ho

(57) ABSTRACT

A memory device can include at least one cathode formed in first opening of a first insulating layer; at least one anode formed in a second opening of second insulating layer, the second insulating layer being a different vertical layer than the first insulating layer; and a memory layer comprising an ion conductor layer extending laterally between the at least one anode and cathode on the first insulating layer, the ion conductor layer having a thickness in the vertical direction less than a depth of the first opening.

46 Claims, 12 Drawing Sheets

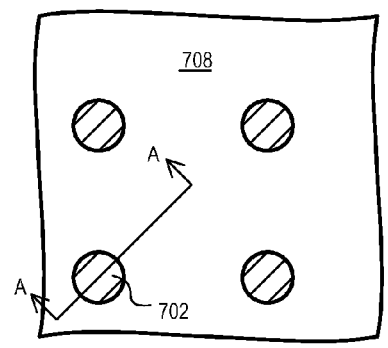
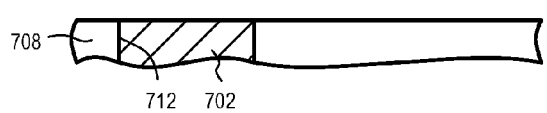
FIG. 6          FIG. 7A
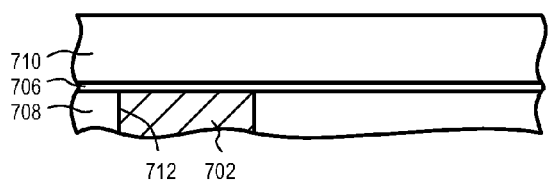
FIG. 7B
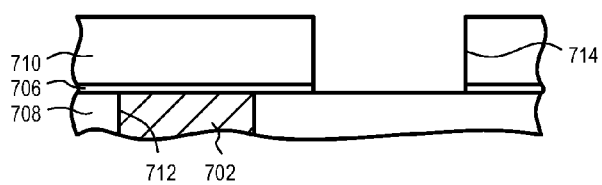 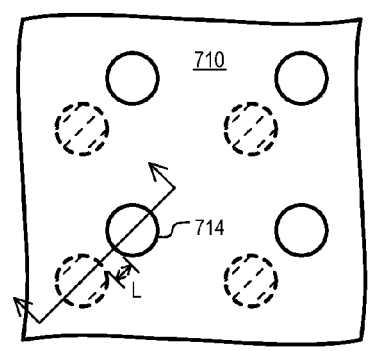
FIG. 7C-0          FIG. 7C-1
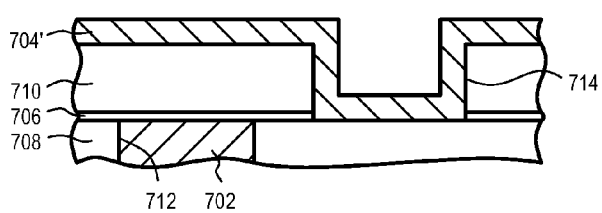
FIG. 7D

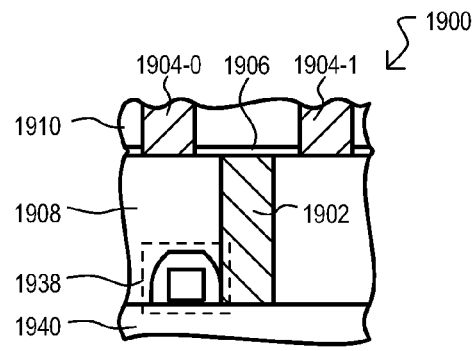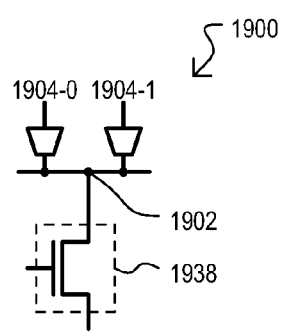
FIG. 19A    FIG. 19B
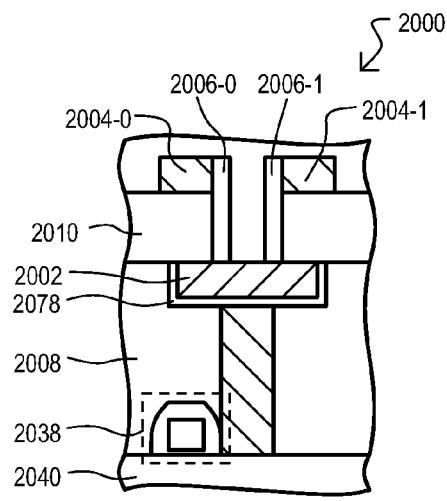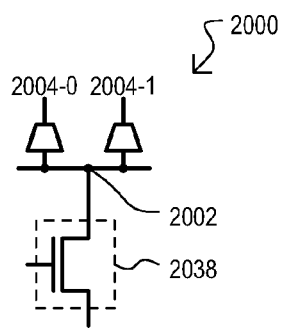
FIG. 20A    FIG. 20B

VARIABLE IMPEDANCE MEMORY ELEMENT STRUCTURES, METHODS OF MANUFACTURE, AND MEMORY DEVICES CONTAINING THE SAME

TECHNICAL FIELD

The present disclosure relates generally to memory devices, and more particularly to variable impedance structures in memory devices for storing data values.

BACKGROUND

FIG. 21A shows a conventional conductive bridging random access memory (CBRAM) type element 2100 having a bottom cathode (i.e., inert electrode) 2199, an ion conducting layer (solid electrolyte) 2197, and a top anode (i.e., active electrode) 2195. Conventional element 2100 can be programmed between different resistance states by application of a potential between the electrodes (2199 and 2195). Application of a programming potential can cause metal atoms to ionize and ion conduct within ion conducting layer 2197 to form conductive regions, e.g., a "filament" 2193. The presence or absence of such a filament 2193 can determine a data value stored by the memory element 2100. Anode 2195 can be a source of a metal that can ion conduct within ion conducting layer 2197. In the conventional CBRAM type element 2100, ion conducting layer 2197 has a large contact area with the anode 2195 and the cathode 2199, being in contact with a bottom surface of the anode 2195 and a top surface of the cathode 2199. In addition, a filament 2193 remains unconstrained in a direction transverse to filament creation. That is, a filament 2193 can generally grow in the vertical direction of FIG. 21A, and be relatively unconstrained in a horizontal direction (as well as in a direction directed into cross sectional view shown).

A drawback to some conventional CBRAM type elements can be a tendency for a filament to agglomerate back into an electrode and/or within ion conducting layer 2197 in a fashion detrimental to a conductive path between the electrodes (2199 and 2195). A representation of undesirable agglomeration is shown in FIG. 21B. FIG. 21B shows element 2100 after the passage of time and/or after temperature cycles. Agglomeration of atoms of the filament 2193' can result in an undesirable change in resistance of element 2100 from a low resistance to a higher resistance. This can present limits to data retention and/or thermal stability of the memory element 2100.

Another drawback to some conventional CBRAM type elements can be insufficient thermal stability. In particular, if subject to sufficiently high temperatures, or sufficient durations at elevated temperatures, the anode 2195 can agglomerate in an amount large enough to create an electrical short between the electrodes (e.g., 2199 and 2195) through the ion conducting layer (e.g., 2197). A representation of undesirable agglomeration of the anode 2195 is shown in FIG. 21C. Grain 2196 of agglomerated anode 2195' can contact electrode 2199. Such a contact can be detrimental to the ability of a memory element 2100 to be programmed to a high-resistance state. This can present limitations on the ability of a memory cell 2100 to store data based on changes in impedance.

BRIEF DESCRIPTION OF THE DRAWINGS

FIGS. 6 to 7E are various views showing a method of manufacturing a memory device according to an embodiment.

FIGS. 9A to 9B-1 are various views showing a method of manufacturing a memory device according to a further embodiment.

FIGS. 19A and 19B are diagrams showing multiple memory elements connected to an access device according to an embodiment.

FIGS. 20A and 20B are diagrams showing multiple memory elements connected to an access device according to another embodiment.

DETAILED DESCRIPTION

Figure 1A:
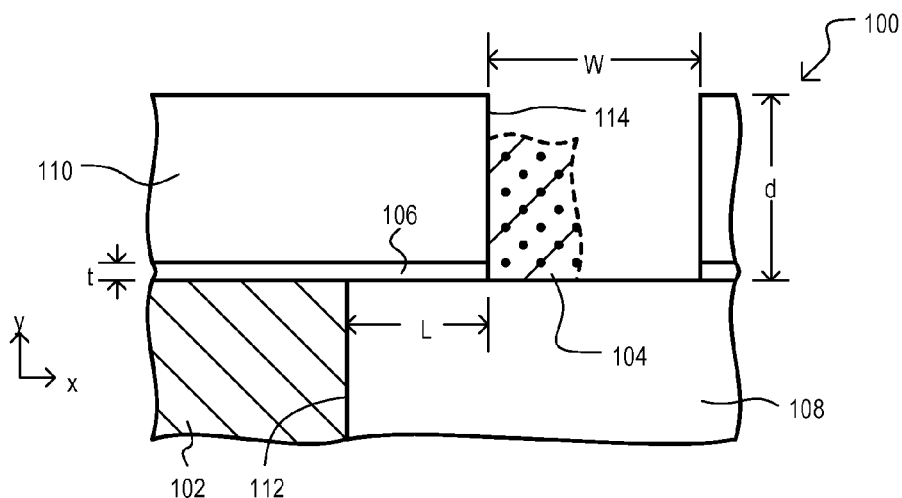
FIGS. 1A to 1I are side cross sectional views of memory elements according to embodiments having a constrained memory layer that extends in a lateral direction.

Embodiments disclosed herein show memory elements that can include a memory layer that can store data based on changes in impedance. In particular embodiments, a memory layer can include an ion conducting layer with filament forming regions that can provide for greater data retention and/or thermal stability. Particular embodiments can also include structures, layers, and fabrication methods which can provide for greater thermal stability of an anode in a memory element.

In the various embodiments shown below, like items can be referred to by the same reference character but with the leading digit(s) corresponding to the figure number.

Referring to FIG. 1A, a memory element 100 according to an embodiment is shown in a side cross sectional view. A memory element 100 can be included as one of many memory elements in a memory device.

A memory element 100 can include a first electrode 102, a second electrode 104, and a memory layer 106. A first electrode 102 can be formed in an opening 112 of a first insulating layer 108 and a second electrode 104 can be formed in an opening 114 in a second insulating layer 110. As shown, first and second insulating layers 108/110 can be different vertical layers. As will be described in more detail below, in some embodiments, a first or second electrode (102 or 104) can fill its corresponding insulating layer opening (112 or 114). However, in other embodiments, a first or second electrode (102 or 104) can only partially fill its corresponding insulating layer opening.

A memory layer 106 can extend in a lateral direction (shown by an x-axis) on first insulating layer 108. A thickness (t) of memory layer 108 can be substantially less than a depth (d) of the opening in first insulating layer 108. In the embodiment shown, first and second electrodes (102 and 104) can be laterally offset from one another by a separation distance (L). In a particular embodiment, a distance L can be less than a minimum width (W) of an opening (112 or 114) containing the first or second electrodes (102 or 104). That is, a separation distance (L) can be smaller than a minimum feature size achievable by a photolithographic process that forms openings (112 or 114).

Further, a separation distance (L) can be substantially larger than a thickness (t) of the memory layer 106. Memory layer 106 can contact a vertical (i.e., side) surface of second electrode 104. In the embodiment shown, memory layer 106 can also contact a horizontal (i.e., top) surface of first electrode 102. However, in some embodiments, a memory layer 106 may only contact a vertical (i.e., side) surface of first electrode 102. In other embodiments, a memory layer 106 may extend in a lateral direction so as to contact the bottom horizontal surface of a second electrode 104.

It is understood that FIG. 1A shows but one embodiment, and alternate embodiments can include any of numerous variations in electrode position, memory layer path, and/or memory layer contact location.

In particular alternate embodiments, a memory layer can have one or more bends (changes in direction) in the space between electrodes. Further, a memory layer can contact either electrode by way of an edge (e.g., as memory layer 106 contacts second electrode 104 in FIG. 1A) or by way of a surface (e.g., as memory layer 106 contacts first electrode 102 in FIG. 1A). Still further, a memory layer can contact more than one surface of an electrode. In addition, electrodes can overlap one another in vertical and/or horizontal directions.

FIGS. 1B to 1I are side cross sectional views showing various alternate embodiments exhibiting some of the variations noted above.

Figure 1B:
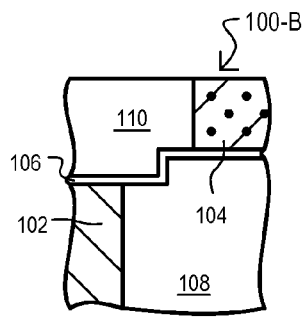

FIG. 1B shows a memory element 100-B having a memory layer 106 with a vertical change in direction between first electrode 102 and second electrode 104. Further, a second electrode 104 is at a higher vertical level than first electrode 102. Further, memory layer 106 contacts second electrode 104 with a top surface.

Figure 1C:
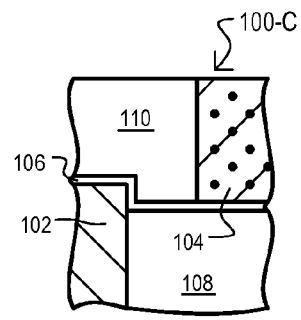

FIG. 1C shows a memory element 100-C having a memory layer 106 that contacts both a top and side surface of first electrode 102, and contacts second electrode via its top surface. Further, FIG. 1C shows first and second electrodes (102 and 104) that overlap one another in a vertical direction.

Figure 1D:
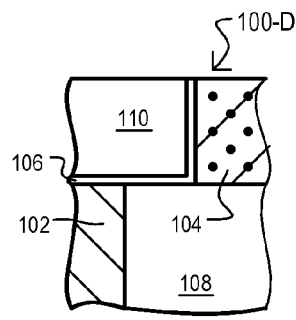

FIG. 1D shows a memory element 100-D like that of FIG. 1A, but with a memory layer that contacts a side surface of second electrode 104 by way of its bottom surface.

Figure 1E:
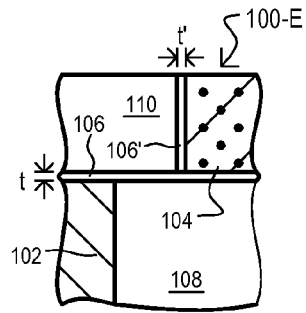

FIG. 1E shows a memory element 100-E that can include two memory layers 106 and 106'. A first memory layer 106 can contact second electrode 104 by way of its top surface. A second memory layer 106' can contact a side surface of the same second electrode 104 by way of one of its surfaces. A second memory layer 106' can the same as, or different from, the first memory layer 106.

Figure 1F:
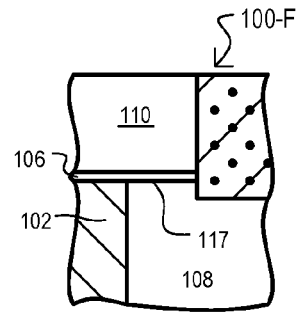

FIG. 1F shows a memory element 100-F having a structure like that of FIG. 1A, but with first and second electrodes (102 and 104) overlapping one another in a vertical direction.

Figure 1G:
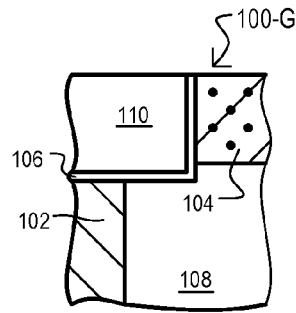

FIG. 1G shows a memory element 100-G having a structure like that of FIG. 1D, but with a bottom surface of second electrode 104 extending above a top surface of first electrode 102.

Figure 1H:
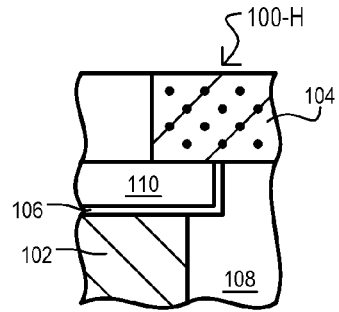

FIG. 1H shows a memory element 100-H having a memory layer 106 that contacts a bottom surface of second electrode 104 by way of an edge. Further, memory layer has a vertical turn in direction.

Figure 1I:
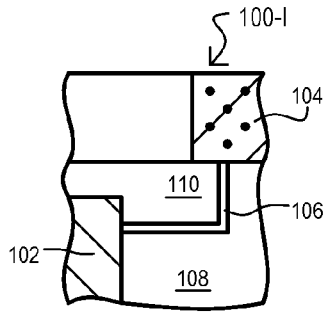

FIG. 1I shows a memory element 100-I like that of FIG. 1H, but with a memory layer 106 that also contacts a surface of first electrode 102 by way of an edge (in this embodiment a side surface of first electrode 102).

In some embodiments, a ratio between a memory layer thickness (t) and a separation distance (L) can be greater than 1:2, preferably greater than 1:3, even more preferably greater than 1:4. In some embodiments, such a ratio can be greater than 1:20.

A memory element 100 can store data based on, at least in part, the impedance of the memory layer 106 between the two electrodes (102 and 104). In a particular embodiment, an impedance of memory layer 106 varies according to the presence (or absence) of a conductive filament created by ions (or atoms reduced from ions) that can ion conduct between the electrodes (102 and 104) in response to one or more electric fields.

Figure 21A:
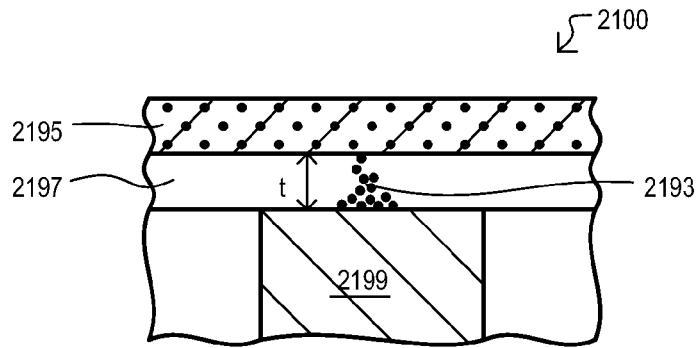
FIGS. 21A to 21C are side cross sectional views showing conventional conductive bridging random access memory (CBRAM) elements.
Figure 21B:
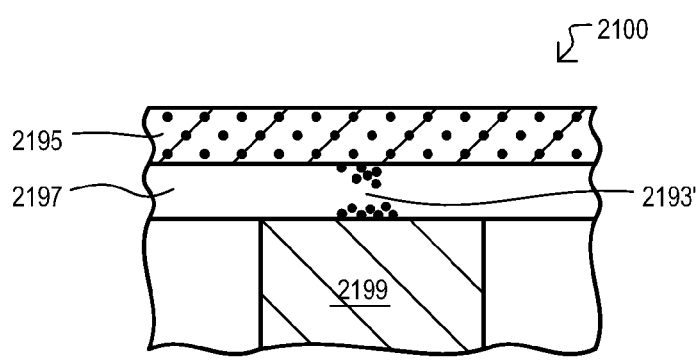

In some embodiments, a second electrode 104 can be an "active" electrode (e.g., an anode) that can be a source of atoms that can ionize and ion conduct through memory layer 106. In other embodiments, a first electrode 102 can be an anode. It is noted that in such an embodiment, in sharp contrast to the conventional CBRAM type memory cell of FIGS. 21A and 21B, a memory layer 106 has a relatively small contact area with anode 104. Further, such a contact area can be dictated by a thickness of the memory layer 106, and not a lithographic limit (i.e., a minimum feature size attainable by etching).

Figure 21C:
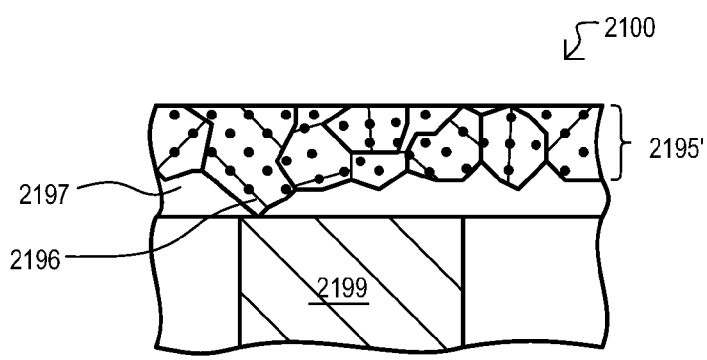

Such a reduced contact area structure can add to cell reliability and reduce defects. In particular, such a structure may not be susceptible to agglomeration affects arising from exposure to heat that lead to a shorting path (conductive path through an ion conducting layer), such as the agglomeration of the anode discussed in conjunction with FIG. 21C. In particular, for such a shorting path to form, metal ions or atoms from one or both electrodes would have to migrate and form a thin conductive layer between the first insulating layer 108 and second insulating layer 110 (i.e., the ions would essentially "un-agglomerate"). Such tendency to migrate into a thin layer may be counter to a natural tendency for one or both electrodes to agglomerate in the manner described in conjunction with FIG. 21C.

In addition, such a reduced contact area can provide greater control the number of, and the manner in which, ions are injected into the memory layer 106, and hence provide greater control in how a filament is formed and/or dissolved. In addition, by having a memory layer 106 contact a side surface of anode 104, contact with a top surface of the electrode can be avoided. In some conventional devices, a top surface of an electrode can have irregular surface features, leading to different programming characteristics, including variations in field flux (among different elements) during programming.

In very particular embodiments, a memory layer 106 can include a chalcogenide, metal oxide, and/or metal oxyhydride that can enable metal ions to ion conduct and form conductive structures (e.g., filaments). An ion conductible metal can include silver and/or copper, as but two of many possible examples. A memory layer 106 can have one or more ion conductible metals incorporated into the layer. In particular embodiments, a memory layer 106 can have a thickness of less than 100 Å, preferably less than 50 Å, even more preferably less than about 10 Å.

In a memory layer 106, a filament can grow on, or immediately adjacent to, a surface of dielectric layer 108 (and/or dielectric layer 110), which is not an ion conducting material. It is believed filaments on such surfaces can agglomerate, or dissolve, at a slower rate than filaments in a conventional element, like that of FIGS. 21A/B, in which a filament can be substantially surrounded by an ion conducting material. Accordingly, filaments formed on non-ion conducting surfaces, as disclosed herein and in equivalent structures, can more robust and less susceptible to agglomeration, leading to greater data retention and/or thermal stability than a conventional approach. We refer to a layer that provides a surface with such an influence on filament stability as a "filament stabilization layer" (FSL).

Figure 2:
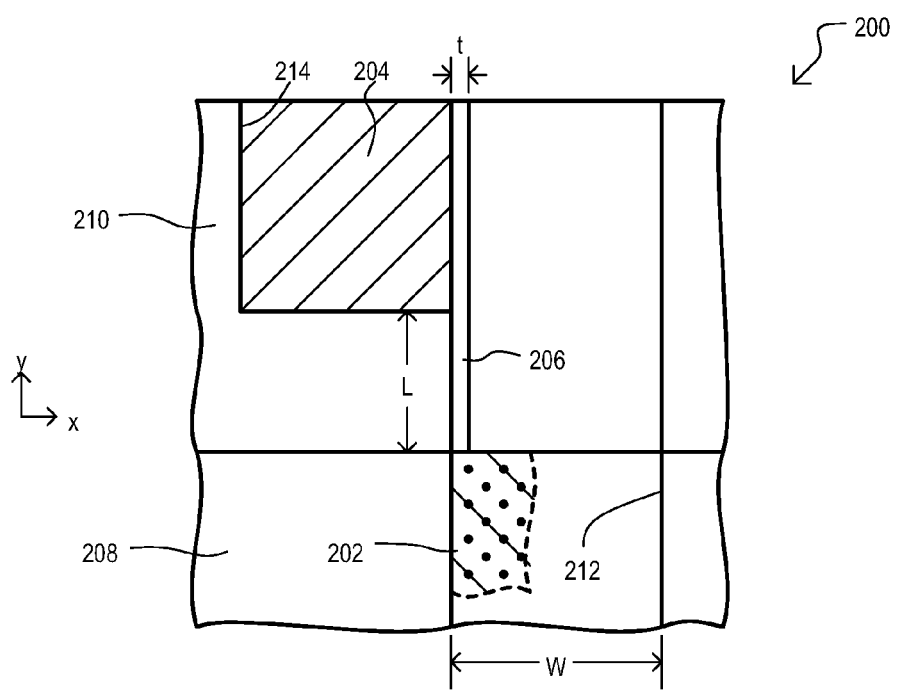
FIG. 2 is a side cross sectional view of a memory element according to an embodiment having a constrained memory layer that extends in a vertical direction.

Referring to FIG. 2, a memory element 200 according to another embodiment is shown in a side cross sectional view. Memory element 200 shows an arrangement like that of FIG. 1A, but with a memory layer 206 being oriented in a vertical, rather than a lateral direction.

As in the case of FIG. 1A, in some embodiments a first or second electrode (202 or 204) can fill its corresponding insulating layer opening (212 or 214). However, in other embodiments, a first or second electrode (202 or 204) can only partially fill its corresponding insulating layer opening.

A memory layer 206 can extend in a vertical direction (shown by a y-axis) on second insulating layer 210. A thickness (t) of memory layer 206 can be substantially less than a width (W) of the opening 212 in first insulating layer 208. First and second electrodes (202 and 204) can be vertically offset from one another by a separation distance (L). A separation distance (L) can be substantially larger than a thickness (t) of the memory layer 206. Memory layer 206 can contact a vertical (i.e., side) surface of second electrode 204. In the embodiment shown, memory layer 206 can also contact a horizontal (i.e., top) surface of first electrode 202. In other embodiments, memory layer 206 may extend downwards in a vertical direction so as to contact a vertical surface of first electrode 202.

As in the case of FIG. 1A, a memory element 200 can store data based on, at least in part, the impedance of the memory layer 206 between the two electrodes (202 and 204). In some embodiments, a first electrode 202 can be an anode. In other embodiments, a second electrode 204 can be an anode. In such an embodiment, a memory layer 206 has a relatively small contact area with anode 202, with the contact area being dictated by a thickness of the memory layer 206, and not a lithographic limit.

In some embodiments, a memory element 200 of FIG. 2 can have dimensions and be formed from the same materials as those shown in FIGS. 1A to 1I, or equivalents.

Figure 3:
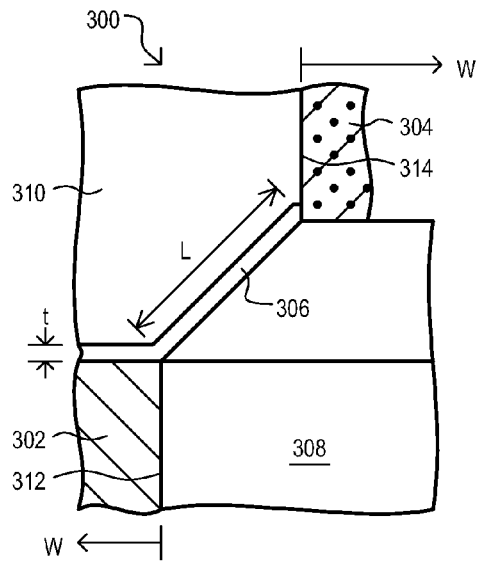
FIG. 3 is a side cross sectional view of a memory element according to an embodiment having a constrained memory layer that extends at a diagonal direction.

Referring to FIG. 3, a memory element 300 according to another embodiment is shown in a side cross sectional view. Memory element 300 shows an arrangement like that of FIG. 1A, but with a memory layer 306 being oriented in a diagonal direction. Such an arrangement can allow a distance L to be greater than a minimum lateral distance between electrodes 304 and 302. In one embodiment, a second electrode 304 can be an anode. In other embodiments, memory layer 306 may extend in the vertical direction so as to contact a vertical surface of a second electrode 304.

Figure 4:
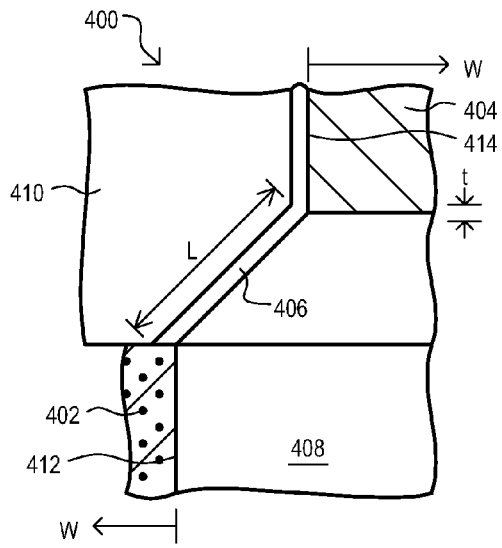
FIG. 4 is a side cross sectional view of another memory element according to an embodiment having a constrained memory layer that extends at a diagonal direction.

Referring to FIG. 4, a memory element 400 according to another embodiment is shown in a side cross sectional view. Memory element 400 shows an arrangement like that of FIG. 2, but with a memory layer 406 being oriented at a diagonal. In one embodiment, a first electrode 402 can be an anode. In other embodiments, a second electrode 404 can be an anode.

Figure 8A:
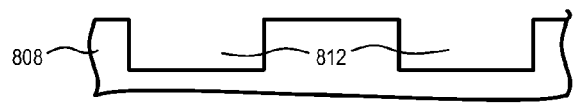
FIGS. 8A to 8G-1 are various views showing a method of manufacturing a memory device according to another embodiment.
Figure 8B:
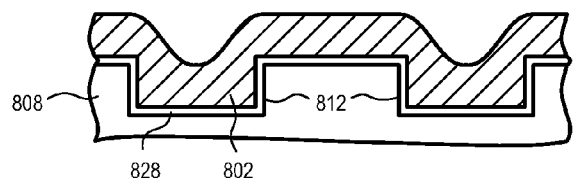
Figure 8C:
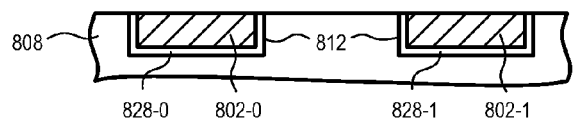
Figure 8D:
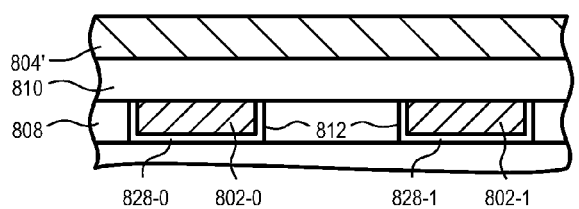
Figure 8E:
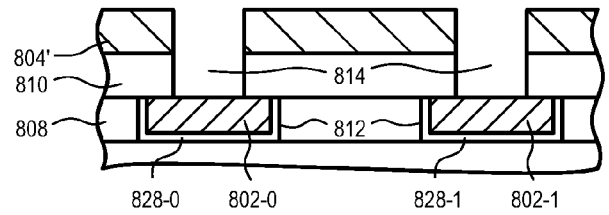
Figure 8F:
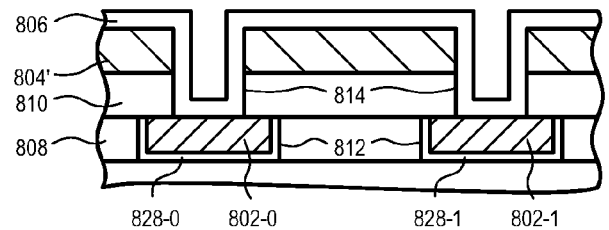
Figures 0, 8G:
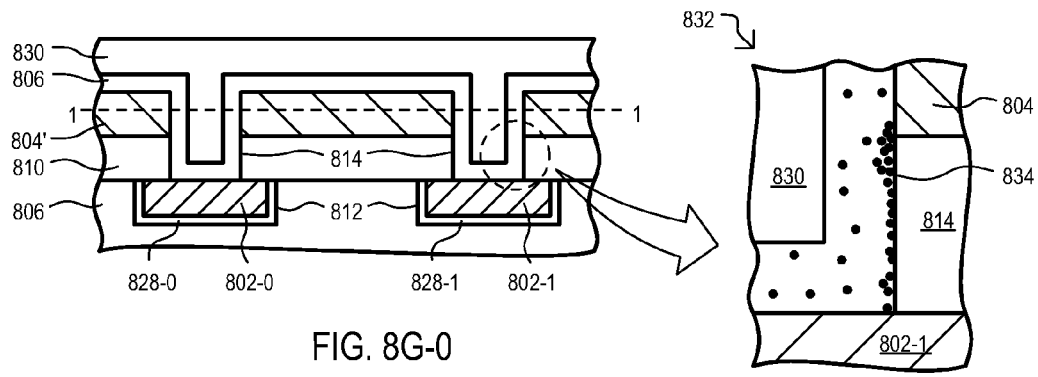
Figures 1, 8G:
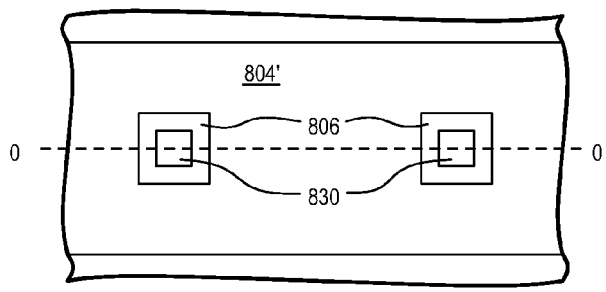

Memory elements 300 and 400 can be subject to the same variations and can provide the same benefits as the embodiment shown in FIGS. 1A to 2.

It is understood that any of FIGS. 1A to 4 can represent a portion of a larger structure. Particular embodiments showing such structures will be described in more detail below. While embodiments can include memory layers having horizontal, vertical and diagonal orientations, other embodiments can include memory layers formed over stepped features. One such embodiment is shown in FIG. 5.

Figure 5:
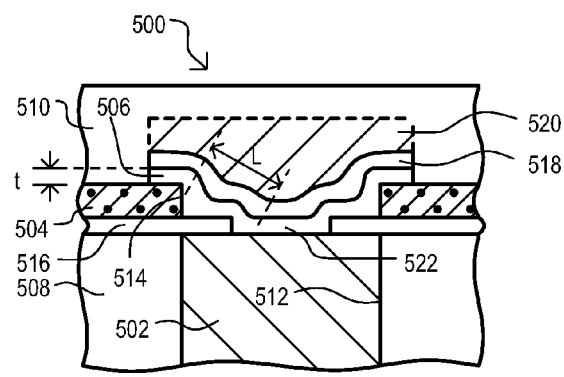
FIG. 5 is a side cross sectional view of a memory element according to an embodiment having a filament stabilization layer and optional third electrode.

Referring to FIG. 5, a memory element 500 according to another embodiment is shown in a side cross sectional view. A memory element 500 can include a first electrode 502, a second electrode 504, a memory layer 506, and a filament stabilization layer (FSL) 516. A first electrode 502 can be formed in an opening 512 in a first insulating layer 508. An FSL 516 can be formed over first insulating layer 508, and can have an FSL opening 522 that exposes a first electrode 502. A second electrode 504 can be formed on FSL 516 in a manner that exposes the FSL 516 in a region between the two electrodes (502 and 504). A memory layer 506 can form a contiguous layer from second electrode 504 over FSL 516 to first electrode 502. A memory layer 506 can include any of the materials described herein, or equivalents.

An FSL 516 can provide a surface upon which a conductive filament can be formed when an electric field is formed between first and second electrodes (502 and 504). An FSL can be a layer over (or through) which a conductive filament can be forced to grow. An FSL can be formed from a material across which a conductive ion does not diffuse quickly. In particular embodiments that include silver and/or copper as a conducting ion, an FSL 516 can include any suitable insulating material, including but not limited to: an insulating nitride, oxide, oxynitride, or oxyhydride, including silicon nitride, silicon oxide, silicon oxynitride, silicon oxyhydride.

Optionally, a memory element 500 can include a third electrode 520 for further controlling an electric field generated during programming operations. During a programming operation (e.g., an operation that alters an impedance of memory layer), first, second and third electrodes (502, 504 and 520) can each be biased to predetermined voltages separately, to arrive at a desired electric field between first and second electrodes (502 and 504) over FSL 516. Inclusion of a third electrode 520 can enable an electric field to be "focused" to provide an optimal field for a desired filament growth pattern and/or growth rate. Inclusion of a third electrode 520 can also enable an electric field to have a component that is substantially perpendicular to the electric field components produced by a voltage difference between a first electrode 502 and a second electrode 504. This can cause ions in a memory layer 506 to ion conduct in a direction substantially perpendicular to the direction in which they would ion conduct due to the application of a voltage difference between a first electrode 502 and a second electrode 504 alone. Such perpendicular ion conduction may aid in a programming operation, and in one very embodiment may aid in the programming operation which causes the impedance of the memory layer 506 to increase.

Figure 7E:
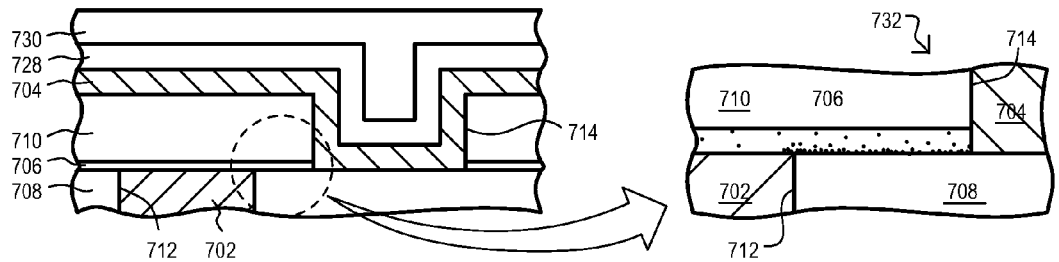

Referring now to FIGS. 6 to 7E, a method of manufacturing a memory device according to an embodiment will now be described. In a very particular embodiment, FIGS. 6 to 7E shows a memory device having a memory element like that shown in FIG. 1A.

Referring to FIG. 6, a side cross sectional view shows a first electrode 702 formed in an opening 712 of first insulating layer 708. A first insulating layer 708 can include any suitable dielectric layer, including but not limited to: one or more layers of silicon oxide (including doped and undoped types), silicon nitride, silicon oxynitride, a polymer (including a polyimide), a metal oxide, a metal oxynitride, or a metal oxyhydride. A first electrode 702 can be formed from any suitable conductive material. In the embodiment shown, a first electrode 702 can be an inert electrode (i.e., an electrode that does not contribute mobile ions to a memory layer). In a particular embodiment, a first electrode 702 can be a tungsten plug with an adhesion liner composed of titanium and/or titanium nitride.

Referring to FIG. 7A, a top plan view shows a memory device corresponding to FIG. 6. The cross sectional plane shown in FIG. 6 is shown by line A-A of FIG. 7A. The particular embodiment of FIG. 7A shows the formation of four first electrodes (one shown as 702).

Referring to FIG. 7B, a side cross sectional view shows a memory layer 706 formed over, and in contact with, a first electrode 702. A second insulating layer 710 is shown formed on memory layer 706. A memory layer 706 can be a chalcogenide and/or metal oxide, as but two examples. In a very particular embodiment, a memory layer 706 can include a layer of germanium disulfide (GeS$_2$) doped with silver and/or copper. A second insulating layer 710 can be formed from any of those materials noted for the first insulating layer 708, or an equivalent.

Referring to FIG. 7C-0, a side cross sectional view shows a second opening 714 formed in second insulating layer 710. In the embodiment shown, any portion of memory layer 706 formed below second opening 714 can be removed. This can expose memory layer 706 on a side surface of the second opening 714.

Referring to FIG. 7C-1, a top plan view shows a memory device corresponding to FIG. 7C-0. As shown, a second opening 714 can be laterally offset from a first opening 712 (and hence first electrode 702) by a separation distance "L". In one embodiment, a separation distance L can be less than a width of first opening 712 or second opening 714. In another embodiment, a separation distance L can be less than a width of both first opening 712 and second opening 714. In still another embodiment, one or both of openings 712/714 can present a minimum feature size opening, and a distance L can be less than such a minimum feature size.

Referring to FIG. 7D, a side cross sectional view shows a second electrode layer 704' formed over second insulating layer 710 and within second opening 714. In the embodiment shown, a second electrode layer 704' can contact sides of a second opening 714, including portions of memory layer 706 exposed by the formation of second opening 714. Further, a second electrode layer 704' can cover a bottom of second opening 714. However, in alternate embodiments, a second electrode layer 704' can cover only a portion of the bottom of the second opening 714.

In the embodiment shown, a second electrode layer 704' does not fill second opening 714, but is conformal to the side and bottom of the opening 714. A second electrode layer 704' can have a thickness less than half the width of the second opening 714. However, in alternate embodiments, a second electrode layer 704' can fill a second opening 714. A second electrode layer 704' can be a contiguous structure forming one second electrode for multiple memory elements, or can be patterned into separate second electrodes 704.

Referring to FIG. 7E, a side cross sectional view shows an encapsulating layer 728 formed on second electrode 704. A top insulating layer 730 can be formed over encapsulating layer 728. In one embodiment, a second electrode 704 can be an anode, and an encapsulating layer 728 can serve as a barrier to ionizable conductive atoms within the anode. In very particular embodiments, an encapsulating layer 728 can be formed from any of: silicon nitride or silicon oxynitride. A top insulating layer 730 can be formed from any of those noted for the first insulating layer 708, or an equivalent.

In embodiments with a memory layer 706 that includes a metal oxide, an arrangement like that shown in FIG. 7E, in which a second electrode 704 is surrounded by an encapsulating layer 728 and insulating layer 710, can provide for greater thermal stability of the anode 704 by preventing the agglomeration discussed in the Background.

FIG. 7E also shows magnified portion 732, which shows how the embodiment of FIGS. 6 to 7E can arrive at a structure like that shown in FIG. 1A.

Referring now to FIGS. 8A to 8G-1, a method of manufacturing a memory device according to a further embodiment will now be described.

Referring to FIG. 8A, a side cross sectional view shows first openings 812 formed in first insulating layer 808. A first insulating layer 808 can be formed from any of those noted for the first insulating layer 708 of FIG. 7B, or an equivalent.

Referring to FIG. 8B, an encapsulating layer 828 can be formed that covers surfaces of first openings 812. An encapsulating layer 828 can be formed from any of those noted for encapsulating layer 728 of FIG. 7E, or an equivalent. A first electrode layer 802' can be formed over encapsulating layer 828 and within at least a portion of first openings 812. A first electrode layer 802' can be formed from a material suitable for an anode (i.e., it can include a metal that can ionize and conduct within an ion conducting memory layer). As in the case of FIG. 7E, inclusion of encapsulating layer 828 can provide for greater thermal stability of resulting memory elements.

Referring to FIG. 8C, a planarization step can be performed which results in multiple anodes 802-0/1, having an encapsulating layer 828-0/1 formed on bottom and side surfaces.

Referring to FIG. 8D, a second insulating layer 810 can be formed. A second electrode layer 804' can be formed over second insulating layer 810. A second electrode layer 804' can be formed of any conductive material suitable to form cathodes.

Referring to FIG. 8E, second openings 814 can be formed through second electrode layer 804' and second insulating layer 810 to expose all, or a portion of a top surface of anodes 802-0/1. Second electrode layer 804' can be a contiguous electrode for multiple memory elements, or can be patterned into separate second electrodes.

Referring to FIG. 8F, a memory layer 806 can be formed over second electrode layer 804' and within second openings 814. In the embodiment shown, a memory layer 806 can cover the sides and bottoms of second openings 814. However, in alternate embodiments, a memory layer 806 can cover only a portion of the bottom of the second openings 814. A memory layer 806 can be a contiguous structure for multiple memory elements, or can be patterned into smaller sections. It is also noted that memory layer 806 can contact side surfaces of second electrode layer 804'.

Referring to FIG. 8G-0, a top layer 830 can be formed over memory layer 806 and within second openings 814. A top layer 830 can be formed from any of those noted for the first insulating layer 708 of FIG. 7B, or an equivalent. Alternatively, a top layer 830 can be conductive layer. In very particular embodiments, a conductive top layer 830 can serve as a third electrode. Such a third electrode can enable electric field focusing or shaping, as noted in conjunction with FIG. 5.

FIG. 8G-0 also shows a magnified portion 832, which shows how a filament 834 can be formed along a separation distance L, in an essentially two-dimensional fashion.

Referring to FIG. 8G-1, a top cross sectional view is shown that is taken along the plane indicated by line 1-1 of FIG. 8G-0. As shown, a second electrode layer 804' can be a contiguous for multiple memory elements. It is understood that the cross section of FIG. 8G-0 is taken along the plane indicated by line 0-0 of FIG. 8G-1.

Figure 9A:
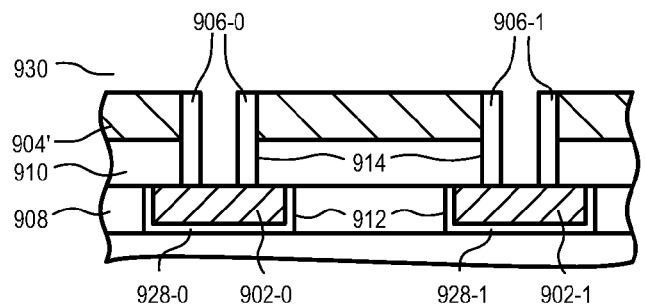
Figures 0, 9B:
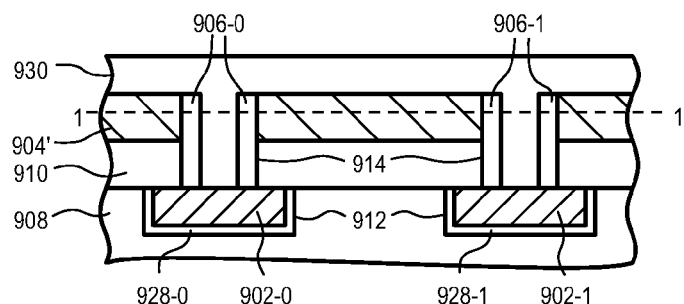
Figures 1, 9B:
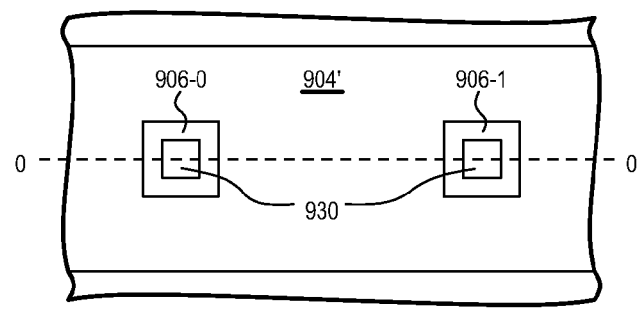

Referring now to FIGS. 9A to 9B-1, a method of manufacturing a memory device according to a further embodiment will now be described. In a very particular embodiment, FIGS. 9A-0 to 9B-1 show a memory device having a memory element like that shown in FIG. 2.

In the method of FIGS. 9A to 9B-1 it is assumed that process steps have been performed like those shown in FIGS. 8A to 8F, to arrive at a structure like that shown in FIG. 8F.

Referring to FIG. 9A, a removal step, such as an anisotropic etching step, can remove portions of memory layer to expose a top surface of anodes 902-0/1. In the embodiment shown, a removal step can also remove portions of memory layer on a top surface of second electrode layer 904'. Accordingly, a memory layer can include sidewall memory layers 906-0/1. Such sidewall memory layers 906-0/1 can only contact side surfaces of second electrode layer 904'.

FIGS. 9B-0 and 9B0-1 show side cross sectional views corresponding to FIGS. 8G-0 and 8G-1, respectively.

It is noted that the embodiment of FIGS. 9A to 9B-1, as compared to that of FIGS. 8A to 8G-1, can result in a smaller contact area between memory layers (906-0/1) and anodes 902-0/1. In particular, such an area of contact can depend upon a thickness of a memory layer, and not a lithographic limit.

Figure 10A:
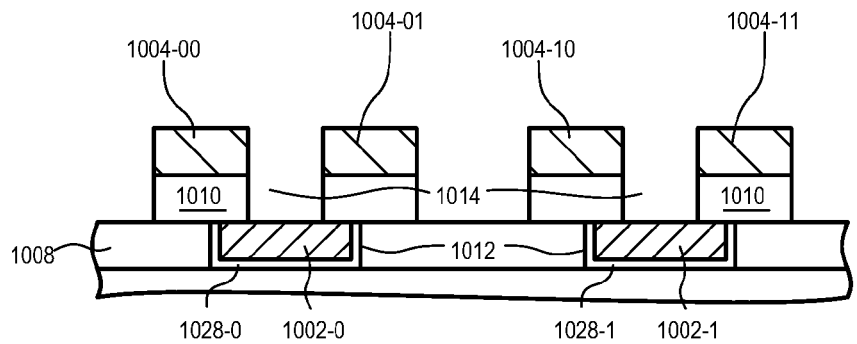
FIGS. 10A to 10D are side cross sectional views showing a method of manufacturing a memory device according to another embodiment.
Figure 10B:
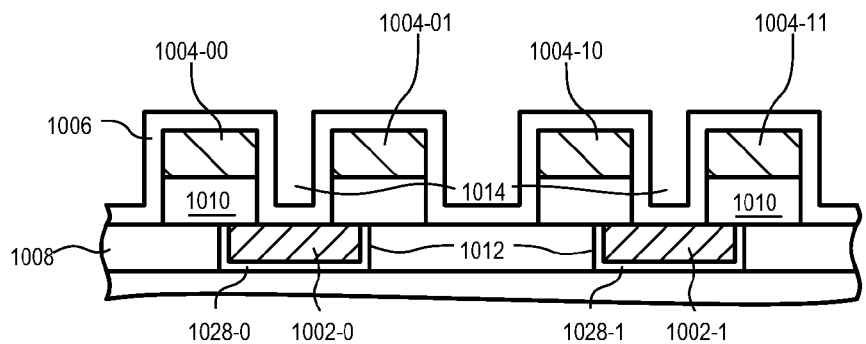
Figure 10C:
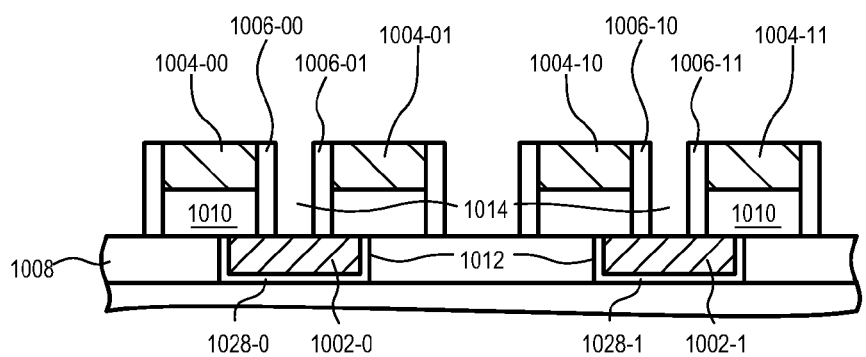
Figure 10D:
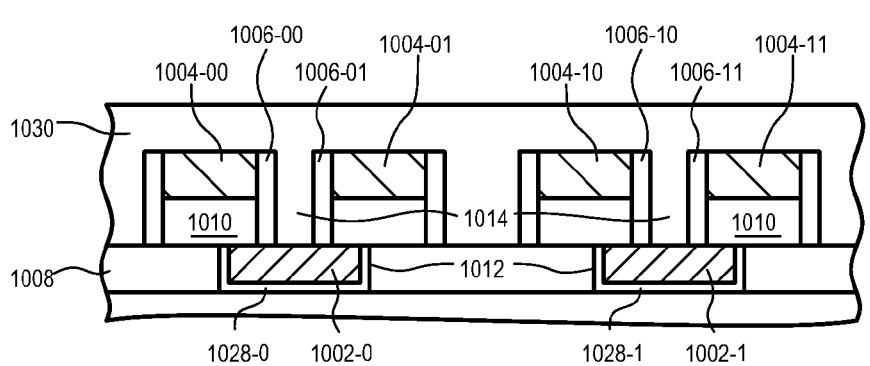

Referring now to FIGS. 10A to 10D, a method of manufacturing a memory device according to a further embodiment will be described. In a very particular embodiment, FIGS. 10A-0 to 10D show a memory device having a memory element like that shown in FIG. 2.

In the method of FIGS. 10A to 10D, it is assumed that process steps have been performed like those shown in FIGS. 8A to 8D, to arrive at a structure like that shown in FIG. 8D.

Referring to FIG. 10A, a second electrode layer 1004' and second insulating layer 1010 can be patterned to create separate second electrodes 1004-00 to -11 and second openings 1014. Second openings 1014 can expose all, or a portion of a top surface of anodes 1002-0/1.

Referring to FIG. 10B, a memory layer 1006 can be formed, as described in FIG. 8F, or an equivalent.

Referring to FIG. 10C, a removal step can take place, as described in FIG. 9A, or an equivalent.

FIG. 10D shows a side cross sectional view corresponding to FIGS. 8G-0.

It is noted that, like the embodiment of FIGS. 9A to 9B-1, the embodiment of FIGS. 10A to 10D can result in a smaller contact area between memory layers (1006-00 to -11) and anodes 1002-0/1. Further, the embodiment of FIG. 10D includes separate second electrodes (1004-00 to -11), which can be biased separately during programming operations and/or data read operations.

Embodiments above have shown memory materials (e.g., ion conducting layers) formed on and/or between a non-ion conducting material, or between two dissimilar non-ion conducting materials, upon which a filament can be grown and dissolved. For example, FIGS. 1A-4 show memory layers 106/206/306/406 formed between first and second dielectric layers (108/208/308/408 and 110/210/310/410). As noted above, filament growth on such dielectric layers may be less susceptible to agglomeration. Similarly, FIG. 5 shows an embodiment in which a filament can be grown on an FSL 516 disposed between electrodes (502 and 504).

Figure 11:
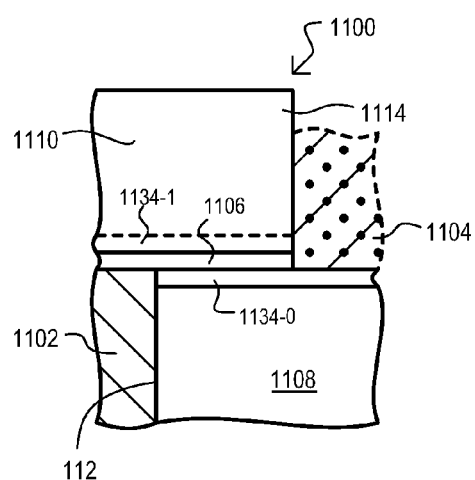
FIG. 11 is a side cross sectional view of a memory element having a special purpose layer according to an embodiment.

Referring to FIG. 11, a memory element 1100 according to an embodiment is shown in a side cross sectional view. A memory element 1100 can include sections like those of FIG. 1A. However, unlike a FIG. 1A, a special purpose layer 1134-0 can be formed in contact with memory layer 1106, between memory layer 1106 and first insulating layer 1108.

In one embodiment, a special purpose layer 1134-0 can be a filament stabilization layer (FSL) as noted above in conjunction with FIG. 5. Such an FSL layer can have the properties and variations noted above. In other embodiments, a special purpose layer 1134-0 can be a surface region of first insulating layer 1108 which has been subjected to a special treatment. Such a treatment may provide the surface with the properties of a filament stabilization layer discussed in conjunction with FIG. 5. In certain embodiments, this surface treatment can include exposure to a plasma, liquid, or gaseous chemical. In certain other embodiments, this surface treatment can include exposure to light or heat. In one very specific embodiment, this chemical may include one or more of those chemicals commonly used to modulate the time dependent dielectric breakdown (TDDB) of Cu interconnects, such as $NH_3$ plasma, $H_2$ plasma, $NH_4OH$ wet chemical, or $NH_4OH$ plus diluted HF wet chemicals, as but a few examples. In certain other embodiments, the surface treatment of a first insulating layer 1108 may be performed during a chemical mechanical polishing process used to planarize a horizontal surface of a first insulating layer 1108 and a first electrode 1102.

Referring still to FIG. 11, optionally, a memory element 1100 can include a second special purpose layer 1134-1 formed in contact with memory layer 1106, between memory layer 1106 and second insulating layer 1110.

In particular embodiments, special purpose layer 1134-1 can be an electrical conductor. In such an embodiment, an electrical connection may exist between special purpose layer 1134-1 and a second electrode 1104. Such an embodiment may aid in data retention. When a conductive filament is grown through a memory layer 1106 between a first electrode 1102 and a second electrode 1104, agglomeration of the filament (e.g., due to heat exposure, time, or a combination of time and heat) may cause the impedance of the cell to increase. In embodiments having a conductive special purpose layer 1134-1, however, the gaps in the filament caused by agglomeration may be "shunted" by the electrical signal passing through the special purpose layer 1134-1 instead of the filament. In this way, a loss of data retention may be prevented.

In one embodiment, a special purpose layer 1134-1 can be a filament stabilization layer (FSL) as noted above in conjunction with FIG. 5. Such an FSL can have the properties and variations noted above. In certain other embodiments, a special purpose layer 1134-1 can be a formed through a special treatment of memory layer 1106. Such treatment may include exposure to plasma, liquid, or gaseous chemicals as discussed above in conjunction with special purpose layer 1134-0.

Figure 12:
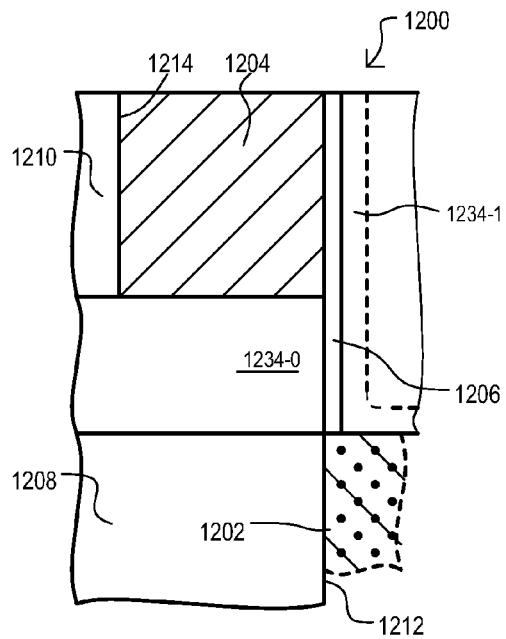
FIG. 12 is a side cross sectional view of a memory element having a special purpose layer according to another embodiment.

Referring to FIG. 12, a memory element 1200 according to another embodiment is shown in a side cross sectional view. A memory element 1200 can include sections like those of FIG. 2, but can include a special purpose layer 1234-0 as described for FIG. 11, but disposed in a vertical direction. As in the case of FIG. 11, a memory element 1200 may optionally include a second special purpose layer 1234-1 disposed on memory layer 1206 in a side opposite to that of special purpose layer 1234-0.

It is understood that one or more special purpose layers as shown in FIGS. 11 and 12 can be applied to any other suitable embodiment shown herein.

As noted in conjunction with FIG. 5, embodiments can include conductive structures that can enable greater variation in an electric field applied across a memory layer than conventional two electrode structures. Additional embodiments providing such greater electric field variation will now be described.

Figure 13:
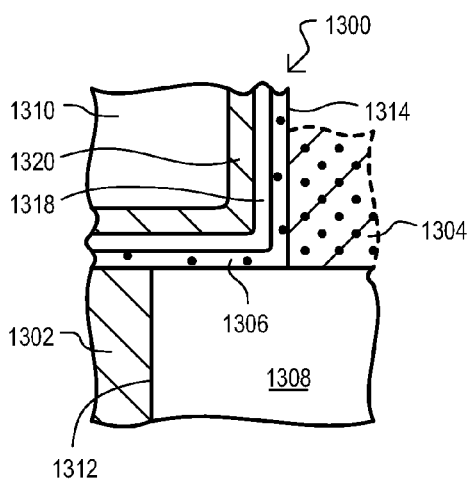
FIG. 13 is a side cross sectional view of a memory element having a third electrode according to another embodiment.

Referring to FIG. 13, a memory element 1300 according to an embodiment is shown in a side cross sectional view. A memory element 1300 can include sections like those of FIG. 1A. However, unlike a FIG. 1A, memory element 1300 can include a third electrode 1320 separated from memory layer 1306 by an isolation dielectric 1318. A third electrode 1320 can be formed from any suitable conductive material including metals, metal alloys, other metal compounds (e.g., silicides), or metal nitrides, as but a few examples. While FIG. 13 shows third electrode 1320 having a relatively small thickness, in alternate embodiments, a third electrode can have a greater thickness.

An isolation dielectric 1318 can be formed from any suitable insulating material, and can be a deposited film or a grown film (layer formed by oxidizing an existing material).

Figure 14:
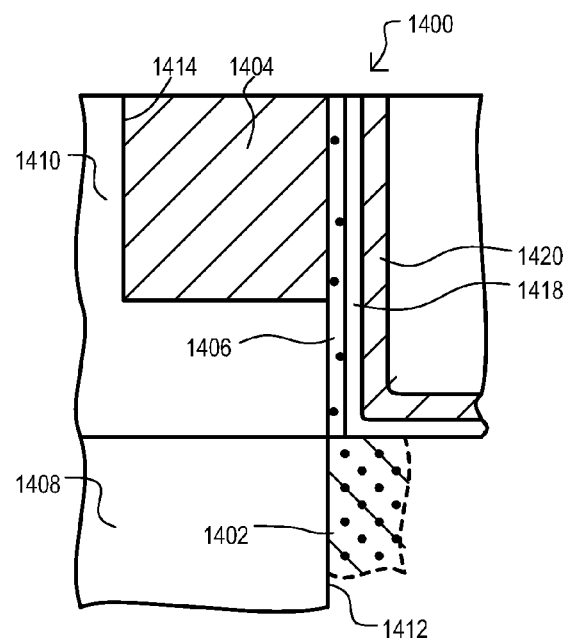
FIG. 14 is a side cross sectional view of a memory element having a third electrode according to a further embodiment.

Referring to FIG. 14, a memory element 1400 according to another embodiment is shown in a side cross sectional view. A memory element 1400 can include sections like those of FIG. 2, but can include a third electrode 1420 separated from memory layer 1406 by an isolation dielectric 1418. Third electrode 1420 and isolation dielectric 1418 can be formed in the manner noted for items 1318 and 1320 of FIG. 13, or an equivalent manner.

While some embodiments above have shown configurations with a memory layer disposed between two electrodes, where one electrode can be an anode, while the other is cathode, other embodiments can include memory cells that share one anode among multiple cathodes and/or one cathode among multiple anodes. Examples of such embodiments will now be described.

It is understood that any of the first type and/or second type electrodes shown below in FIGS. 15A to 17C can take the form of any suitable electrode shown herein, or equivalents.

Figure 15A:
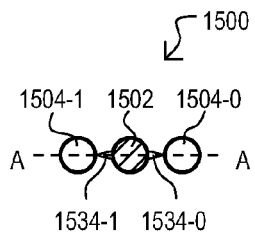
FIGS. 15A to 15C are a series of views showing a memory element having a first electrode shared with multiple second electrodes, according to embodiments.
Figure 15B:
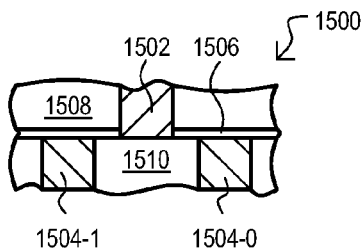
Figure 15C:
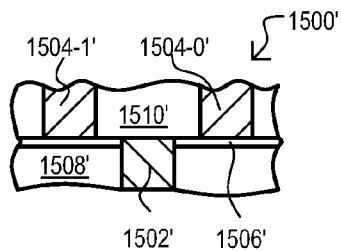

Referring to FIGS. 15A to 15C, embodiments having one electrode shared among two other electrodes are shown in a series of views.

FIG. 15A is a top plan view of a memory element 1500 according to an embodiment. A memory element 1500 can include a first type electrode 1502 and two second type electrodes 1504-0/1. In one embodiment, first type electrode 1502 can be an anode, and second type electrodes 1504-0/1 can be cathodes. However, in another embodiment, first type electrode 1502 can be a cathode, and second type electrodes 1504-0/1 can be anodes.

Referring still to FIG. 15A, in particular embodiments, memory element 1500 can include an ion conducting layer in which conductive filaments can be grown and dissolved between the first type electrode 1502 and second type electrodes 1504-0/1. FIG. 15A shows two possible filaments 1534-0/1 that can be grown. It is noted that the presence/absence of filaments 1534-0/1 can represent as few as two data states, or a greater number of data states. In one embodiment, each combination of possible filament states ($2^2$) can represent a different stored value. However, even more than four data states can be represented in embodiments that can program an impedance of memory layer between more than two impedance states.

FIG. 15B is a side cross sectional view showing one implementation of memory cell 1500 of FIG. 15A, taken along the plane shown by line A-A. A first type electrode 1502 can be a top electrode, while second type electrodes 1504-0/1 can be lower electrodes. A memory layer 1506 can extend laterally between the first type electrode 1502 and the second type electrodes 1504-0/1. In the embodiment shown, memory layer 1506 can contact a side surface of first type electrode 1502.

FIG. 15C is a side cross sectional view showing another implementation of the memory cell of FIG. 15A, also taken along plane A-A. FIG. 15C shows a memory cell 1500' having an arrangement like that of FIG. 15B, but with the first type electrode 1502' being a lower electrode and second type electrodes 1504-0'/1' being upper electrodes.

Figure 16A:
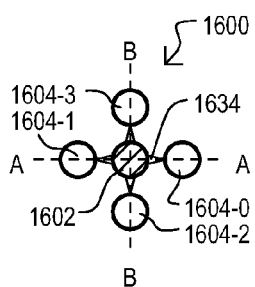
FIGS. 16A to 16C are a series of views showing a memory element having a first electrode shared with multiple second electrodes according to another embodiment.
Figure 16B:
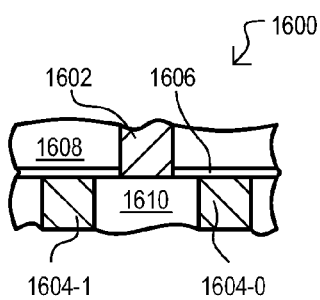
Figure 16C:
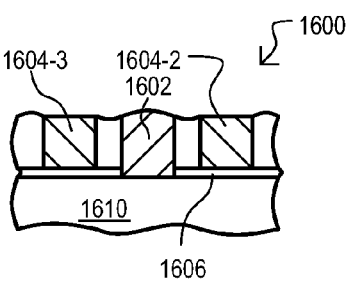

Referring to FIGS. 16A to 16C, an embodiment having one electrode shared with other electrodes on different vertical levels is shown in a series of views.

FIG. 16A is a top plan view of a memory element 1600 according to an embodiment. A memory element 1600 can include a first type electrode 1602 and four second type electrodes 1604-0 to -3. As in the case of FIGS. 15A to 15C, a first type electrode 1602 can be an anode, and second type electrodes 1604-0 to -3 can be cathodes, or vice versa. Further, in some embodiments, filaments can be grown between first type electrode 1602 and the multiple second type electrodes 1604-0 to -3. FIG. 16A shows one of the four possible filaments 1634 that can be grown. In binary filament programming (e.g., filament has high or low resistance), such filament states can represent as few as two data states, or as many as 16 different data states. As understood from above, even more data states are possible for memory layers programmable between more than two impedance states.

FIG. 16B is a side cross sectional view taken along the plane shown by line A-A of FIG. 16A. A first type electrode 1602 can be a top electrode, while type second type electrodes 1604-0/1 can be lower electrodes. A memory layer 1606 can extend laterally between the first type electrode 1602 and the second type electrodes 1604-0/1. In the embodiment shown, a memory layer 1606 can contact a side surface of first type electrode 1602.

FIG. 16C is a side cross sectional view taken along the plane shown by line B-B of FIG. 16A. As shown, while second type electrodes 1604-0/1 (shown in FIG. 16B) can be formed at one vertical layer (i.e., a lower vertical level than first type electrode 1602), second type electrodes 1604-2/3 can be formed on different vertical level than second type electrodes 1604-0/1 (i.e., a same vertical level as the first type electrode 1602).

Figure 17A:
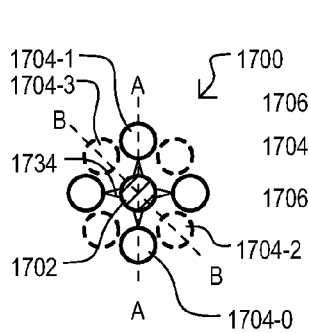
FIGS. 17A to 17C are a series of views showing a memory element having a first electrode shared with multiple second electrodes on different vertical levels, according to an embodiment.
Figure 17B:
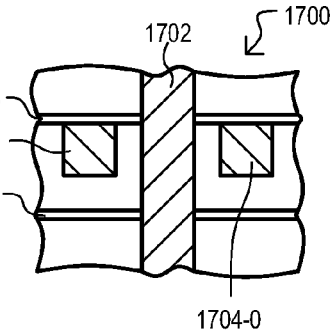
Figure 17C:
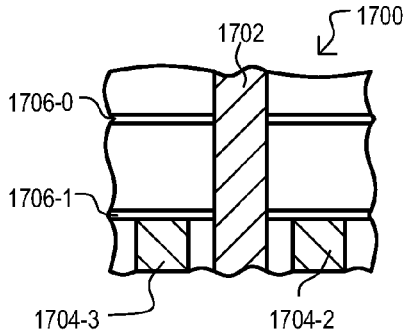

Referring to FIGS. 17A to 17C, an embodiment having multiple memory layers at different vertical levels is shown in a series of views.

FIG. 17A is a top plan view of a memory element 1700 according to an embodiment. A memory element 1700 can include multiple second type electrodes (four shown as 1704-0 to -3) formed around a first type electrode 1702. As in the case of FIGS. 15A to 15C, a first type electrode 1702 can be an anode and second type electrodes (e.g., 1704-0 to -3) can be cathodes, or vice versa. Further, in some embodiments, different filaments (one shown as 1734) can be grown between first type electrode 1702 and the multiple second type electrodes (e.g., 1704-0 to -3).

FIG. 17B is a side cross sectional view taken along the plane shown by line A-A of FIG. 17A. A first type electrode 1702 can be in contact with a first memory layer 1706-0 and a second memory layer 1706-1, where the second memory layer 1706-1 is on a different vertical level than first memory layer 1706-0. In the particular embodiment shown, a first memory layer 1706-0 can contact top surfaces of second type electrodes 1704-0/1 formed at a first vertical level.

FIG. 17C is a side cross sectional view taken along the plane shown by line B-B of FIG. 17A. In the particular embodiment shown, a second memory layer 1706-1 can contact top surfaces of second type electrodes 1704-2/3 formed at a second vertical level lower than that of the second type electrodes 1704-2/3.

In the embodiment shown, both first and second memory layers 1706-0/1 can contact a side surface of first type electrode 1702. Further, as the case of FIG. 1A, a contact area can be dictated by a thickness of the memory layers (1706-0/1) and not a lithographic limit.

While FIGS. 15A to 17C show first and second electrodes having circular shapes in cross section, it is understood that such electrodes can include various other shapes.

FIGS. 18A to 18D are top plan views showing various embodiments in which a second type electrode can be a conductive line.

Figure 18A:
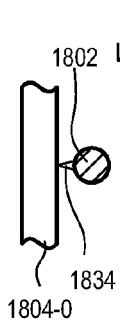
FIGS. 18A to 18D are a series of top plan views showing memory elements having a first electrode shared with multiple second electrodes according to various embodiments.

FIG. 18A shows a memory element 1800 having a first type electrode 1802 formed adjacent to a second type electrode 1804-0. It is understood that a memory layer can be formed between first type electrode 1802 and second type electrode 1804-0 to enable the formation of a filament (shown as 1834).

Figure 18B:
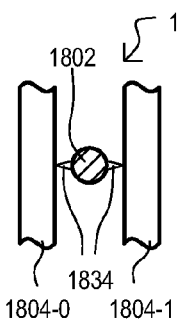

FIG. 18B shows a memory element 1800' having two second type electrodes 1804-0/1 on opposing sides of a first type electrode 1802. Conductive filaments 1834 can be formed between first type electrode 1802 and the second type electrodes 1804-0/1.

Figure 18C:
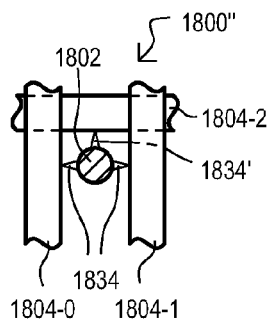

FIG. 18C shows a memory element 1800" having three second type electrodes 1804-0 to -2 on different sides of a first type electrode 1802. Second type electrodes 1804-0/1 can be formed on one vertical layer. Second type electrode 1804-2 can be formed on a different vertical layer than second type electrodes 1804-0/1. A first memory layer can be formed between second type electrodes 1804-0/1 and first type electrode 1802 to enable first layer filaments 1834 to be formed. A second memory layer can be formed between second type electrode 1804-2 and first type electrode 1802 to enable second layer filaments 1834' to be formed.

Figure 18D:
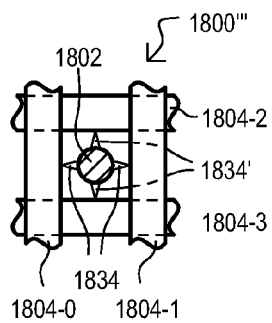

FIG. 18D shows a memory element 1800''' with arrangement like that of FIG. 18C, but with two second type electrodes 1804-2/3 formed on a different level than second type electrodes 1804-0/1. Thus, first layer filaments 1834 can be formed between second type electrodes 1804-0/1 and first type electrode 1802 while, on a different vertical level, second layer filaments 1834' can be formed between second type electrodes 1804-2/3 and first type electrode 1802.

Memory elements as described herein, and equivalents, and enable multiple memory elements to be accessible by a single active device (e.g., transistor, diode, thyristor structure, etc.). Such a capability can enable high storage density for a memory device. Two of many possible examples of multiple elements connected to a same access device are shown below.

Referring to FIGS. 19A and 19B, a memory device according to an embodiment is shown in side cross sectional view and corresponding schematic diagram.

FIG. 19A is a side cross sectional view showing a memory device 1900 having an arrangement like that of FIG. 1A, in which a memory layer 1906 extends in a lateral direction across a separation distance between a first electrode 1902 and two different second electrodes 1904-0/1. A first electrode 1902 can have a conductive connection to an access device 1938 formed in a semiconductor substrate 1940. As shown in a schematic diagram in FIG. 19B, in the particular embodiment shown, a first electrode 1902 can serve as a common cathode for multiple anodes (i.e., second electrodes 1904-0/1).

Referring to FIGS. 20A and 20B, a memory device according to another embodiment is shown in side cross sectional view and corresponding schematic diagram.

FIG. 20A is a side cross sectional view showing a memory device having an arrangement like that of FIG. 2, in which memory layers 2006-0/1 extend in a vertical direction across a separation distance between a first electrode 2002 and two different second electrodes 2004-0/1. A first electrode 2002 can have a conductive connection to an access device 2038 formed in a semiconductor substrate 2040. As shown in the schematic diagram of FIG. 20B, in the particular embodiment shown, a first electrode 2002 can serve as a common anode for multiple cathodes (i.e., second electrodes 2004-0/1).

It is understood that any of the first and/or second electrodes shown in FIGS. 19A to 20B can take the form of any suitable electrode shown herein, or equivalents.

Memory elements and described in embodiments herein, and equivalents, can provide memory layers, such as ion conductor layers, with confined filament growth upon a non-ion conducting surface. Filament creation can occur in a two-dimensional like fashion, for slower dissolution, and hence increased thermal stability and data retention, as compared to conventional approaches.

In embodiments shown herein, memory layers can have reduced contact area with active electrodes enabling a focused introduction of ions from the active electrode into the memory layer. Such an arrangement can allow for greater control of programming operations (formation of filaments from ions provided by the anode, and dissolution of filaments back into the anode).

In particular embodiments, the arrangement of electrodes and a confined memory layer can result in similar electric flux profiles in program operations that create a filament (i.e., programs), and program operations that dissolve a filament (i.e., erases).

A memory structures and method according to the embodiments may be included in, and used to form, storage elements in a standalone memory device (i.e., a memory device providing substantially only storage functions). In alternate embodiments, such a memory device may be embedded into larger integrated circuit device. In particular embodiments, such memory structures can be formed at a "back-end" of a manufacturing process, being formed after active devices (e.g., transistors) have been formed in a semiconductor substrate, or the like.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
at least one cathode formed in a first opening of a first insulating layer;
at least one anode formed in a second opening of second insulating layer, the second insulating layer being at a different vertical layer than the first insulating layer; and
a memory layer comprising an ion conductor layer extending laterally between the at least one anode and cathode on the first insulating layer, the ion conductor layer having a thickness in the vertical direction less than a depth of the first opening; wherein
the second opening is separated from the first opening in the lateral direction.

2. The memory device of claim 1, wherein:
the anode has a side surface that extends vertically away from the first insulating layer; and
the ion conductor contacts a surface of the anode selected from the group of: a side surface and a bottom surface of the anode.

3. The memory device of claim 1, wherein:
the cathode has a surface parallel to the first insulating layer; and
the ion conductor layer contacts a top surface of the cathode.

4. The memory device of claim 1, wherein:
the ion conductor layer is selected from: a chalcogenide and a metal oxide.

5. The memory device of claim 1, wherein:
the first opening has width in the lateral direction; and
the second opening has the width in lateral direction, and is separated from the first opening in the lateral direction by less than the width of either the first opening or the second opening.

6. The memory device of claim 1, further including:
an encapsulating layer formed over the anode to confine ionizable atoms of the anode.

7. The memory device of claim 6, wherein:
the encapsulating layer extends into the first opening.

8. The memory device of claim 6, wherein:
the anode comprises a metal selected from: silver and copper; and
the encapsulating layer comprises a material selected from: silicon nitride.

9. The memory device of claim 1, further including:
a third electrode formed between the anode and cathode and separated from the ion conductor layer by an isolation dielectric.

10. The memory device of claim 1, wherein:
the at least one anode includes a plurality of surrounding anodes formed around a same central cathode; and
the ion conductor layer is formed in contact with the surrounding anodes and the central cathode.

11. The memory device of claim 1, wherein:
at least one cathode includes a plurality of surrounding cathodes formed around a same central anode; and
the ion conductor layer is formed in contact with the surrounding cathodes and the central anode.

12. The memory device of claim 1, wherein:
the cathode extends to a selection device formed in a substrate below the first insulating layer.

13. The memory device of claim 12, wherein:
the selection device is selected from the group of: a transistor, a diode, and a thyristor device.

14. The memory device of claim 1, wherein:
the anode extends to a selection device formed in a substrate below the first insulating layer.

15. The memory device of claim 14, wherein:
the selection device is selected from the group of: a transistor, a diode, and a thyristor device.

16. The memory device of claim 1, wherein:
the memory layer has a bend in the space between the cathode and anode electrodes.

17. A memory device, comprising:
at least one anode formed in a first insulating layer having a first surface;
at least one cathode separated from the anode by a second insulating layer and having a side surface at a different planar orientation than the first surface of the anode;
an opening through at least the second insulating layer that exposes at least a portion of the first surface of the anode; and
an ion conductor layer formed on a side surface of the opening that contacts the first surface of the anode and covers less than all of the exposed portion of the first surface of the anode.

18. The memory device of claim 17, wherein:
the ion conductor layer covers the exposed portion of the first surface of the anode.

19. The memory device of claim 17, wherein:
the ion conductor layer is selected from: a chalcogenide and a metal oxide.

20. The memory device of claim 17, further including:
the anode has second surface opposite first surface, and a side surface spanning the first and second surfaces; and
an encapsulating layer that covers at least the second and side surfaces, the encapsulating layer to confine ionizable atoms of the anode.

21. The memory device of claim 20, wherein:
the anode comprises a metal selected from: silver and copper; and
the encapsulating layer comprises a material selected from: silicon nitride.

22. A memory device, comprising:
a bottom electrode formed in a first insulating layer;
a top electrode having a side surface that extends above the first insulating layer; and
an ion conductor layer that extends in a lateral direction in contact with the bottom electrode and the side surface of the top electrode; wherein
the bottom electrode is separated from the top electrode in the lateral direction.

23. The memory device of claim 22, wherein:
the bottom electrode is a cathode; and
the top electrode is an anode comprised of at least one material that can ion conduct in the ion conductor layer.

24. The memory device of claim 23, wherein:
the cathode has a top surface; and
the ion conductor layer covers the top surface of the cathode.

25. The memory device of claim 22, wherein:
the top electrode includes at least one conductive layer formed in an opening of the first insulating layer.

26. The memory device of claim 25, wherein:
the at least one conductive layer conforms to the side and bottom of the opening in the first insulating layer.

27. The memory device of claim 25, further including:
an encapsulating layer over the at least one conductive layer formed from material that prevents migration of metal of the at least one conductive layer.

28. The memory device of claim 22, wherein:
the bottom electrode is an anode comprised of at least one material that can ion conduct in the ion conductor layer; and
the top electrode is a cathode.

29. The memory device of claim 28, wherein:
the bottom electrode includes a top surface in contact with the ion conductor layer, a bottom surface, and a side surface spanning the top and bottom surfaces; and
an encapsulating layer in contact with the bottom and side surface, the encapsulating layer formed from a material that prevents migration of metal in the anode.

30. The memory device of claim 28, further including:
a second insulating layer formed over the anode and having an opening therein; and
the ion conductor layer is formed in the opening and contacts the anode at a bottom of the opening.

31. The memory device of claim 30, wherein:
the ion conductor layer is formed on a side surface of the opening and covers only a portion of the bottom of the opening.

32. The memory device of claim 22, wherein:
the ion conductor layer is selected from: a chalcogenide and a metal oxide.

33. A memory device, comprising:
at least one cathode formed in a first opening of a first insulating layer;
at least one anode formed in a second opening of second insulating layer, the second insulating layer being at a different vertical layer than the first insulating layer; and
a memory layer comprising an ion conductor layer extending laterally between the at least one anode and cathode on the first insulating layer, the ion conductor layer having a thickness in the vertical direction less than a depth of the first opening; wherein
the at least one anode includes a plurality of surrounding anodes formed around a same central cathode, and
the ion conductor layer is formed in contact with the surrounding anodes and the central cathode.

34. The memory device of claim 33, wherein:
the anode has a side surface that extends vertically away from the first insulating layer; and
the ion conductor contacts a surface of the anode selected from the group of: a side surface and a bottom surface of the anode.

35. The memory device of claim 33, wherein:
the cathode has a surface parallel to the first insulating layer; and
the ion conductor layer contacts a top surface of the cathode.

36. The memory device of claim 33, wherein:
the ion conductor layer is selected from: a chalcogenide and a metal oxide.

37. The memory device of claim 33, wherein:
the first opening has width in the lateral direction; and
the second opening has the width in lateral direction, and is separated from the first opening in the lateral direction by less than the width of either the first opening or the second opening.

38. The memory device of claim 33, wherein:
the cathode extends to a selection device formed in a substrate below the first insulating layer.

39. The memory device of claim 33, wherein:
the anode extends to a selection device formed in a substrate below the first insulating layer.

40. A memory device, comprising:
at least one cathode formed in a first opening of a first insulating layer;
at least one anode formed in a second opening of second insulating layer, the second insulating layer being at a different vertical layer than the first insulating layer; and
a memory layer comprising an ion conductor layer extending laterally between the at least one anode and cathode on the first insulating layer, the ion conductor layer having a thickness in the vertical direction less than a depth of the first opening; wherein
at least one cathode includes a plurality of surrounding cathodes formed around a same central anode; and
the ion conductor layer is formed in contact with the surrounding cathodes and the central anode.

41. The memory device of claim 40, wherein:
the anode has a side surface that extends vertically away from the first insulating layer; and
the ion conductor contacts a surface of the anode selected from the group of: a side surface and a bottom surface of the anode.

42. The memory device of claim 40, wherein:
the cathode has a surface parallel to the first insulating layer; and
the ion conductor layer contacts a top surface of the cathode.

43. The memory device of claim 40, wherein:
the ion conductor layer is selected from: a chalcogenide and a metal oxide.

44. The memory device of claim 40, wherein:
the first opening has width in the lateral direction; and
the second opening has the width in lateral direction, and is separated from the first opening in the lateral direction by less than the width of either the first opening or the second opening.

45. The memory device of claim 40, wherein:
the cathode extends to a selection device formed in a substrate below the first insulating layer.

46. The memory device of claim 40, wherein:
the anode extends to a selection device formed in a substrate below the first insulating layer.

\* \* \* \* \*